United States Patent [19]

Morris et al.

[11] Patent Number: 4,789,889

[45] Date of Patent: Dec. 6, 1988

[54] INTEGRATED CIRCUIT DEVICE HAVING SLANTED PERIPHERAL CIRCUITS

[75] Inventors: Stephen W. Morris, Stillwater Township, Sussex County; Richard P. Lydick, Readington Township, Hunterdon County, both of N.J.

[73] Assignee: GE Solid State Patents, Inc., Somerville, N.J.

[21] Appl. No.: 799,825

[22] Filed: Nov. 20, 1985

[51] Int. Cl.⁴ ............................................. H01L 23/48
[52] U.S. Cl. ........................................ 357/68; 357/69; 357/70; 357/41; 357/40
[58] Field of Search ....................... 357/68, 69, 70, 41, 357/40

[56] References Cited

U.S. PATENT DOCUMENTS

| | | | |
|---|---|---|---|
| 3,808,475 | 4/1974 | Buelow et al. | 357/40 |
| 4,125,798 | 11/1978 | Miller | 318/574 |
| 4,278,897 | 7/1981 | Ohno et al. | 357/40 X |
| 4,413,271 | 11/1983 | Gontowski, Jr. et al. | 357/40 OR |

FOREIGN PATENT DOCUMENTS

| | | | |
|---|---|---|---|
| 59-21035 | 2/1984 | Japan | 357/69 X |
| 59-43553 | 3/1984 | Japan | 357/69 X |

*Primary Examiner*—Andrew J. James
*Assistant Examiner*—William A. Mintel
*Attorney, Agent, or Firm*—Stanley C. Corwin; Birgit E. Morris; Kenneth R. Glick

[57] ABSTRACT

The present invention sets forth an integrated circuit (IC) device wherein the IC chip includes peripheral circuits, such as input/output circuits, which are arranged non-perpendicular with respect to the rectangular shape of the active area of the IC. This structure permits positioning some of the terminal bond pads closely adjacent the corners of the chip without overlap of adjacent circuits.

6 Claims, 2 Drawing Sheets

INTEGRATED CIRCUIT DEVICE HAVING SLANTED PERIPHERAL CIRCUITS

The present invention relates to integrated circuit chips and more particularly to the physical positioning of certain circuits therein.

BACKGROUND OF THE INVENTION

Integrated circuit chips (IC's), of the type to which the present invention pertains, are usually of rectangular shape having a central area containing the integrated circuit. FIG. 1 illustrates such a prior art IC device which includes an IC chip 10 attached to a lead frame pad 12 in the usual manner. A plurality of terminal contact fingers 14 are spaced about the periphery of the pad 12. A series of connector wires 16 electrically interconnect the fingers 14 to terminal bond pads 18 which are disposed on the IC chip 10 about its periphery. A central area 20 of rectangular shape, which contains the integrated circuit of the device, is shown enclosed by a dashed line having sides 22. The individual terminal bond pads 18 are interconnected to the integrated circuit contained within the central area 20 via the peripheral circuits 30. The peripheral circuits 30, in the present case input/output circuits, are arranged in a rectangular shape and disposed between the sides 22 of the central area 20 and the bond pads 18 as shown in FIG. 1. The peripheral circuits 30 are limited to the area of the IC chip 10 which is directly adjacent the side 22 because of the need to prevent inadvertent overlap of the circuits within the corner areas 32 of the chip. The physical layout of the chip is usually generated by a computer system which expects the peripheral circuits 30 to be arranged in approximate rectangular or elongated shapes. The elongated shaped circuits 30 are further arranged so that their approximate longitudinal axes, one of which is indicated at 34 in FIG. 1, are substantially perpendicular to the sides 22. It is readily apparent, by examination of FIG. 1, that two circuits 30a which are mutually perpendicular and adjacent a corner area 32, may not invade that corner area without overlap of the two circuits. To obviate this potential problem, it has become customary in the industry to utilize a computer system for generating the chip layouts which is programmed to avoid placing these peripheral circuits 30 within the corner areas 32. As a result of this, some of the connector wires 16 are inordinately long, especially those connector wires that are attached to contact fingers 14 that are located close to the corners of the chip 10. These inordinately long connector wires are prone to failure due to breaking or shorting against adjacent wires when the finished device is subjected to vibrational loads in use.

One way to alleviate this problem is to distribute the terminal bond pads 18 along the periphery of the chip so that appropriate pads are placed closer to the corners of the chip within the corner areas 32. This presents another problem however. The terminal bond pad 18 is usually included in the layout of the peripheral circuit 30, and therefore, the two are fabricated together in the same process. Should the terminal bond pad 18 be remotely located with respect to its associated peripheral circuit 30, it would no longer be practical to include both in the same layout because to do so would necessarily render each standard peripheral circuit 30 unique. It will be appreciated by those skilled in the art that this would be undesirable for a number of reasons. What must be done is, the terminal bond pad 18 fabricated in its remote position by a process separate from that used to fabricate the associated circuit 30. This, of course, adds to the complexity and cost of manufacturing the device.

SUMMARY OF THE INVENTION

According to the present invention an integrated circuit chip of rectangular shape and having peripheral edges is disclosed. A substantially rectangular area within the chip contains the integrated circuit and is spaced from the peripheral edges. A plurality of terminal pads are disposed along the peripheral edges of the chip. A plurality of peripheral circuits are disposed within the chip between a side of the rectangular area and the terminal pads. Each peripheral circuit is arranged in a generally elongated shape having a longitudinal axis which forms an angle with the side of the rectangular area of less than 90 degrees.

DESCRIPTION OF THE PREFERRED EMBODIMENT

Figure 2:
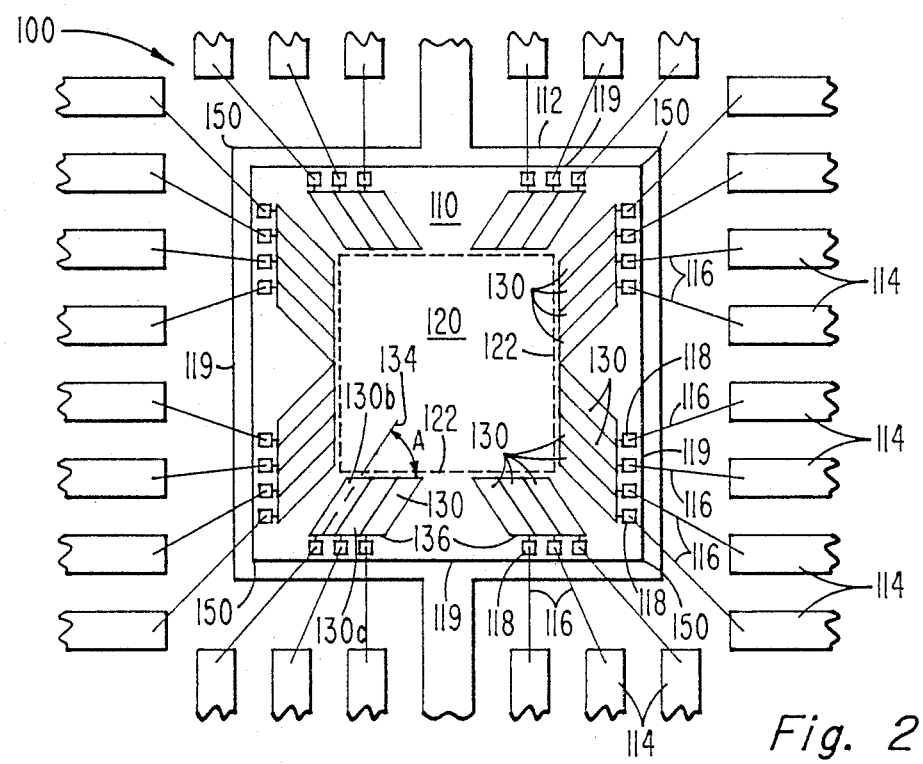
FIG. 2 is a view similar to that of FIG. 1 showing an embodiment of the teachings of the present invention.

There is shown in FIG. 2 an integrated circuit (IC) device 100 including an IC chip 110 which is attached to a lead frame pad 112 in the usual manner. A plurality of terminal contact fingers 114 are spaced about the periphery of the pad 112. A series of connector wires 116 electrically interconnect the fingers 114 to a series of terminal bond pads 118 which are disposed on the IC chip 10 adjacent its peripheral edge 119, as shown in FIG. 2. A central area 120, of substantially rectangular shape, which contains the integrated circuit of the device 100, is shown enclosed by a dashed line having sides 122. A series of peripheral circuits 130, which are arranged in generally elongated shapes, are disposed between the sides 122 of the central area 120 and the bond pads 118, as shown in FIG. 2, and are used to interconnect the bond pads to active elements of the integrated circuit. Each terminal bond pad 118 is associated with an end 136 of a peripheral circuit 130.

Figure 3:
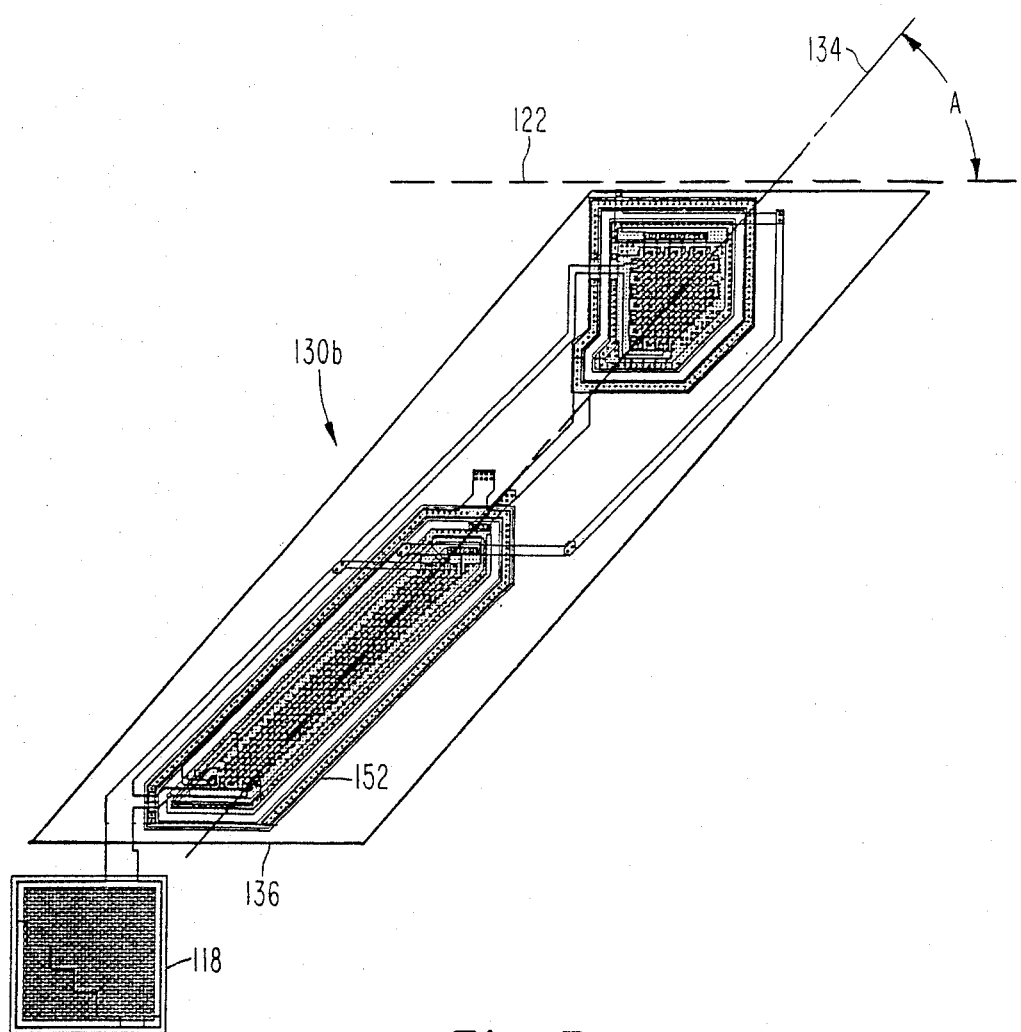
FIG. 3 is a plan view of a typical peripheral circuit.

Unlike the peripheral circuits 30 of the prior art IC chip 10, the peripheral circuits 130 of the device 100 are arranged so that their longitudinal axis 134 are non-perpendicular to the adjacent side 122. That is, the angle A formed by the axis 13 and the side 122, as best seen in FIGS. 2 and 3, is less than 90 degrees. This permits the positioning of the peripheral circuits 130 so that their ends 136 adjacent the terminal bond pads 118 slant toward the corners 150 of the IC chip 110. FIG. 3 shows a specific peripheral circuit 130b which depicts in detail a typical input circuit 152. Note that the end 136 of the circuit 130b is slanted to the left, as viewed in FIG. 3, and that the longitudinal axis 134 forms an angle A with the side 122 of less than 90 degrees. The terminal bond pad 118 is of the conventional type and is positioned closely adjacent the end 136.

Figure 1:
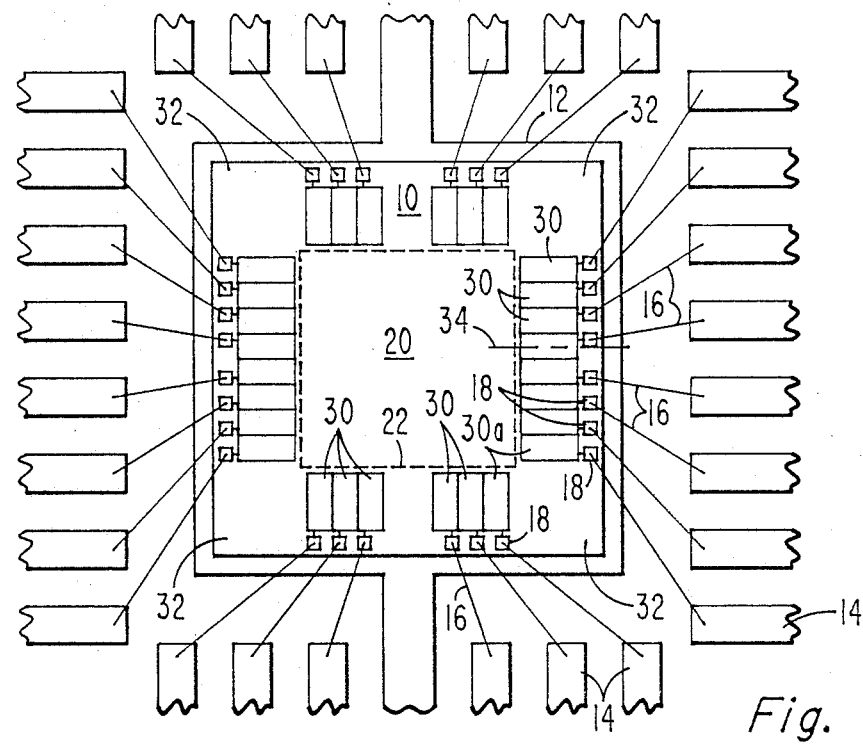
FIG. 1 is a schematic representation of a plan view of a prior art integrated circuit device showing an integrated circuit chip electrically interconnected with terminal contact fingers of a lead frame.

It will be appreciated by those skilled in the art that this structure lends itself to left and right hand slanting arrangements, a left hand arrangement being shown in FIG. 3. The right hand arrangement is simply a mirror image of the left hand one. Again referring to FIG. 2, both left and right hand peripheral circuits 130 are shown disposed about the periphery of the IC chip 110 so that their respective terminal bond pads 118 are distributed substantially closer to the corners 150 than are those of the prior art chip 10 shown in FIG. 1. This results in substantially shorter connector wires 116 interconnecting the fingers 114 to the terminal bond pads 118 nearest the corners 150. The angle A, which is less than 90 degrees but greater than about 45 degrees permits this positioning of the pads 118 relatively close to the corners 150 of the IC chip 110 without the danger of overlapping adjacent circuits 130.

It will also be appreciated by those skilled in the art that the amount of the angle A may vary for adjacent peripheral circuits 130. For example, the angle between the longitudinal axis 134 of the circuit 130b and the side 122 may be less than that of the circuit 130c to the immediate right thereof, although these angles are shown as substantially the same in FIG. 2. Similarly, circuits 130 that are further from the corners 150 would have an angle A that is correspondingly larger. By varying the angle A in this manner, a maximum surface area of the IC chip 110 between the central area 120 and the terminal bond pads 118 could be utilized for the peripheral circuits 130.

An important advantage of the teachings of the present invention is that the terminal bond pads 118 may easily be arranged along the periphery of the chip so as to require relatively shorter connector wires 116. This, in turn, increases the reliability of the finished device by reducing the likelihood of failure due to the breaking of long wires or the shorting together of adjacent wires. Further, this advantage is achieved without the cost of additional processing steps and without rendering each standard peripheral circuit a unique, custom circuit.

We claim:

1. An integrated circuit chip of substantially rectangular shape having peripheral edges, a substantially rectangular area within said chip containing an integrated circuit spaced from said peripheral edges, a plurality of terminal bond pads disposed adjacent said peripheral edges of said chip, a plurality of peripheral circuits which interconnect said terminal bond pads to active elements of said integrated circuit, each of which is arranged in a generally elongated shape having a longitudinal axis and being disposed within said chip between a side of said rectangular area and a respective each of said terminal bond pads, at least one of said terminal bond pads being adjacent a corner of said chip, wherein each said longitudinal axis forms an angle with said side which is other than 90 degrees.

2. The integrated circuit chip set forth in claim 1 wherein each of said longitudinal axes forms substantially the same angle with said side.

3. The integrated circuit chip set forth in claim 2 wherein said angle is less than 90 degrees but greater than about 45 degrees.

4. The integrated circuit chip as set forth in claim 1 wherein said plurality of peripheral circuits includes first and second peripheral circuits, the longitudinal axis of said first circuit forming an angle with said side that is less than that formed by the longitudinal axis of said second circuit.

5. The integrated circuit chip as set forth in claim 4 wherein said first peripheral circuit is disposed adjacent said corner of said chip.

6. The integrated circuit chip as set forth in claim 5 wherein said angle is less than 90 degrees but greater than about 45 degrees.

* * * * *